(12) United States Patent
Christoph

(10) Patent No.: US 8,170,221 B2
(45) Date of Patent: *May 1, 2012

(54) AUDIO ENHANCEMENT SYSTEM AND METHOD

(75) Inventor: Markus Christoph, Straubing (DE)

(73) Assignee: Harman Becker Automotive Systems GmbH, Karlsbad (DE)

( * ) Notice: Subject to any disclaimer, the term of this patent is extended or adjusted under 35 U.S.C. 154(b) by 1182 days.

This patent is subject to a terminal disclaimer.

(21) Appl. No.: 11/944,876

(22) Filed: Nov. 26, 2007

(65) Prior Publication Data

US 2008/0137874 A1   Jun. 12, 2008

Related U.S. Application Data

(63) Continuation of application No. 11/085,807, filed on Mar. 21, 2005, now Pat. No. 7,302,062.

(51) Int. Cl.
*H03G 3/20* (2006.01)
*H04B 1/00* (2006.01)

(52) U.S. Cl. ........ 381/57; 381/94.1; 381/94.3; 381/103; 381/107

(58) Field of Classification Search ............... 381/94.3, 381/94.1, 94.2, 94.7, 57, 103, 107
See application file for complete search history.

(56) References Cited

U.S. PATENT DOCUMENTS

| | | | |
|---|---|---|---|
| 3,714,622 A | 1/1973 | Wilhelmsen |
| 3,934,084 A | 1/1976 | Munson et al. |
| 3,934,085 A | 1/1976 | Munson et al. |
| 4,025,723 A | 5/1977 | Blackledge |
| 4,223,181 A | 9/1980 | Simeau |
| 4,247,955 A | 1/1981 | Wiedemann |
| 4,254,303 A | 3/1981 | Takizawa |
| 4,297,527 A | 10/1981 | Pate |
| 4,306,115 A | 12/1981 | Húmphrey |

(Continued)

FOREIGN PATENT DOCUMENTS

DE    3220758    12/1983    .......................... 3/20

(Continued)

OTHER PUBLICATIONS

Author: Harma. Tittle: Linear Predictive Coding with modified filter structures. Dated: Nov. 2001. Publisher: Trans. Speech Audio Processing 9 : 8. 769-777.*

(Continued)

*Primary Examiner* — Vivian Chin
*Assistant Examiner* — David Ton
(74) *Attorney, Agent, or Firm* — O'Shea Getz P.C.

(57) ABSTRACT

An audio enhancement system for compensating for ambient noise in a listening environment, comprises an audio system that produces an electrical sound signal and generates a sound output from the electrical sound signal. A sensor (e.g., a microphone) senses a total sound signal representative of the total sound level in the listening environment, including the sound output from the audio system and the ambient noise within the listening environment. A processing unit responsive to the total sound signal and the electrical sound signal extracts from the total sound signal an ambient noise signal representative of the ambient noise in the listening environment. A controller responsive to the ambient noise signal performs a linear predictive coding (LPC) analysis and generates a control signal, which is input to an equalizer to adjust the sound output of the audio system in order to compensate for the ambient noise level.

19 Claims, 8 Drawing Sheets

U.S. PATENT DOCUMENTS

| | | |
|---|---|---|
| 4,380,824 A | 4/1983 | Inoue |
| 4,406,923 A | 9/1983 | Burne, III et al. |
| 4,409,435 A | 10/1983 | Ono |
| 4,438,526 A | 3/1984 | Thomalla |
| 4,461,025 A | 7/1984 | Franklin |
| 4,476,571 A | 10/1984 | Tokumo et al. |
| 4,479,237 A | 10/1984 | Sugasawa |
| 4,553,258 A | 11/1985 | Chainer et al. |
| 4,590,593 A | 5/1986 | Rodney |
| 4,598,417 A | 7/1986 | Deno |
| 4,628,526 A | 12/1986 | Germer |
| 4,636,586 A | 1/1987 | Schiff |
| 4,641,344 A | 2/1987 | Kasai et al. |
| 4,649,505 A | 3/1987 | Zinser, Jr. et al. |
| 4,672,674 A | 6/1987 | Clough et al. |
| 4,677,389 A | 6/1987 | Op de Beek et al. |
| 4,696,030 A | 9/1987 | Egozi |
| 4,696,044 A | 9/1987 | Waller, Jr. |
| 4,718,099 A | 1/1988 | Hotvet |
| 4,723,294 A | 2/1988 | Taguchi |
| 4,731,850 A | 3/1988 | Levitt et al. |
| 4,751,739 A | 6/1988 | Serikawa et al. |
| 4,769,847 A | 9/1988 | Taguchi |
| 4,823,391 A | 4/1989 | Schwartz |
| 4,827,458 A | 5/1989 | D'Alayer de Costemore D'Arc |
| 4,837,834 A | 6/1989 | Allie |
| 4,852,175 A | 7/1989 | Kates |
| 4,864,246 A | 9/1989 | Kato et al. |
| 4,887,299 A | 12/1989 | Cummins et al. |
| 4,891,605 A | 1/1990 | Tirkel |
| 4,953,221 A | 8/1990 | Holly et al. |
| 4,956,867 A | 9/1990 | Zurek et al. |
| 4,965,834 A | 10/1990 | Miller |
| 5,018,202 A | 5/1991 | Takahashi et al. |
| 5,018,205 A | 5/1991 | Takagi et al. |
| 5,034,984 A | 7/1991 | Bose |
| 5,048,091 A | 9/1991 | Sato et al. |
| 5,068,834 A | 11/1991 | Fromont |
| 5,077,799 A | 12/1991 | Cotton |
| 5,081,682 A | 1/1992 | Kato et al. |
| 5,089,997 A | 2/1992 | Pecukonis |
| 5,107,539 A | 4/1992 | Kato et al. |
| 5,117,401 A | 5/1992 | Feintuch |
| 5,126,681 A | 6/1992 | Ziegler, Jr. et al. |
| 5,131,047 A | 7/1992 | Hashimoto et al. |
| 5,146,505 A | 9/1992 | Pfaff et al. |
| 5,146,507 A | 9/1992 | Satoh et al. |
| 5,204,971 A | 4/1993 | Takahashi et al. |
| 5,208,866 A | 5/1993 | Kato et al. |
| 5,226,016 A | 7/1993 | Christman |
| 5,243,661 A | 9/1993 | Ohkubo et al. |
| 5,255,324 A | 10/1993 | Brewer et al. |
| 5,267,322 A | 11/1993 | Smith et al. |
| 5,291,558 A | 3/1994 | Ross |
| 5,293,425 A | 3/1994 | Oppenheim et al. |
| 5,311,446 A | 5/1994 | Ross et al. |
| 5,325,437 A | 6/1994 | Doi et al. |
| 5,416,846 A | 5/1995 | Tamura et al. |
| 5,434,922 A | 7/1995 | Miller et al. |
| 5,434,926 A | 7/1995 | Watanabe et al. |
| 5,450,494 A | 9/1995 | Okubo et al. |
| 5,485,523 A | 1/1996 | Tamamura et al. |
| 5,530,761 A | 6/1996 | D'Alayer de Costemore d'Arc |
| 5,539,832 A | 7/1996 | Weinstein et al. |
| 5,615,270 A | 3/1997 | Miller et al. |
| 5,635,903 A | 6/1997 | Koike et al. |
| 5,666,426 A | 9/1997 | Helms |
| 5,757,937 A | 5/1998 | Itoh et al. |
| 5,774,565 A | 6/1998 | Benning et al. |
| 5,778,073 A | 7/1998 | Busching et al. |
| 5,796,847 A | 8/1998 | Kaihotsu et al. |
| 5,872,852 A | 2/1999 | Dougherty |
| 5,884,992 A | 3/1999 | Taylor et al. |
| 6,061,455 A | 5/2000 | Hadley et al. |
| 6,072,881 A | 6/2000 | Linder |
| 6,078,670 A | 6/2000 | Beyer |
| 6,098,036 A | 8/2000 | Zinser, Jr. et al. |
| 6,163,608 A | 12/2000 | Romesburg et al. |
| 6,351,731 B1 | 2/2002 | Anderson et al. |
| 6,370,254 B1 | 4/2002 | Gore et al. |
| 6,415,253 B1 | 7/2002 | Johnson |
| 6,487,529 B1 | 11/2002 | Miet |
| 6,529,605 B1 | 3/2003 | Christoph |
| 6,718,036 B1 * | 4/2004 | Van Schyndel et al. .. 379/406.03 |
| 6,868,162 B1 | 3/2005 | Jubien et al. |
| 7,254,242 B2 * | 8/2007 | Ise et al. ..................... 381/94.3 |
| 2001/0055400 A1 | 12/2001 | Lubbe et al. |
| 2003/0053639 A1 | 3/2003 | Beaucoup et al. |
| 2003/0128851 A1 * | 7/2003 | Furuta ........................ 381/94.2 |
| 2003/0215013 A1 | 11/2003 | Budnikov |
| 2004/0057586 A1 | 3/2004 | Licht |
| 2004/0076302 A1 | 4/2004 | Christoph |
| 2004/0125962 A1 | 7/2004 | Christoph |
| 2005/0013443 A1 | 1/2005 | Marumoto et al. |
| 2005/0058301 A1 | 3/2005 | Brown |
| 2005/0075870 A1 | 4/2005 | Chamberlain |

FOREIGN PATENT DOCUMENTS

| | | | |
|---|---|---|---|
| DE | 3320751 | 12/1984 | ............ 3/20 |
| DE | 3322055 | 12/1984 | ............ 3/20 |
| DE | 3338413 | 5/1985 | ............ 3/20 |
| DE | 4204385 | 8/1993 | ............ 3/20 |
| DE | 19736699 | 2/1999 | ............ 3/24 |
| EP | 0 017 519 | 10/1980 | ............ 11/30 |
| EP | 0 319 777 | 6/1989 | ............ 3/32 |
| EP | 0 623 995 | 11/1994 | ............ 3/32 |
| GB | 2 013 051 | 8/1979 | ............ 3/20 |
| GB | 2 257 317 | 1/1993 | ............ 3/32 |
| JP | 61108212 | 5/1986 | |
| JP | 62092607 | 4/1987 | ............ 3/32 |
| JP | 04047705 | 2/1992 | ............ 5/16 |
| JP | 04070106 | 3/1992 | ............ 3/32 |
| JP | 4094204 | 3/1992 | ............ 3/32 |
| JP | 04302204 | 10/1992 | ............ 3/32 |
| JP | 04365210 | 12/1992 | ............ 3/32 |
| JP | 05037270 | 2/1993 | ............ 3/32 |
| JP | 05220361 | 8/1993 | ............ 71/68 |
| JP | 05259779 | 10/1993 | ............ 3/32 |
| JP | 06069742 | 3/1994 | ............ 3/32 |
| JP | 9116361 | 5/1997 | ............ 3/32 |
| JP | 11225030 | 8/1999 | ............ 3/32 |
| WO | WO 00/04636 | 1/2000 | ............ 9/18 |
| WO | WO 2004/010191 | 1/2004 | ............ 6/43 |

OTHER PUBLICATIONS

Härmä, Aki: "Linear Predictive Coding with Modified Filter Structures".

Härmä, Aki: "Evaluation of a Warped Linear Predictive Coding Scheme," Laboratory of Acoustics and Audio Signal Processing.

Härmä et al.: "A Comparison of Warped and Conventional Linear Predictive Coding".

Härmä et al.: "Frequency-Warped Signal Processing for Audio Applications," Journal of the Audio Engineering Society, Audio Engineering Society, vol. 48, No. 11, Nov. 2000.

ISO/IEC JTC1/SC29/WG11 MPEG, IS11172-73, "Coding of Moving Pictures and Associated Audio," International Organisation for Standardisation, Nov. 11, 1994, pp. 1-104.

Johnston, J.D.: "Perceptual Transform Coding of Wideband Stereo Signals", Proc. ICASSP'99, pp. 2524-2527.

Johnston, J.D.: "Transform Coding of Audio Signals Using Perceptual Noise Criteria", IEEE Journal on Selected Areas in Communications 6, pp. 314-323.

Zwicker et al.: "Psychoacoustics, Facts and Models", Springer Series in Information Sciences, $2^{nd}$ edition, pp. 61-110.

Weiss et al.: "On Adaptive Filtering in Oversampled Subbands", ISBN 3/8265/45/66/4, 1998, pp. 139-166.

Raad et al.: "Audio Coding Based on the Modulated Lapped Transform (MLT) and Set Partitioning in Hierarchical Trees", Proc. $6^{th}$ World Multiconference on Systemics Cybernetics and Informatics (SCI 2002), 3:303-306, Jul. 2002, Orlando FL USA.

Dobson, Richard: "A Dictionary of Electronic and Computer Music Technology", pp. 158-185, Oxford University Press 1992.

* cited by examiner

AUDIO ENHANCEMENT SYSTEM AND METHOD

1. CLAIM OF PRIORITY

This patent application is a continuation of application Ser. No. 11/085,807 filed on Mar. 21, 2005 now U.S. Pat. No. 7,302,062, which is hereby incorporated by reference.

2. FIELD OF THE INVENTION

This invention relates to the field of signal processing, and in particular to an audio system for use in a listening environment such as a vehicle, where the audio system compensates for noise outside the audio system.

3. RELATED ART

When music or speech is reproduced, for example, in a vehicle, the signal is often corrupted by external acoustic noise within the vehicle. This noise is often dependent upon vehicle speed, road condition, weather and condition of the vehicle. The presence of such noise results in a situation where soft sounds of interest are hidden, the perceived loudness is reduced and the intelligibility of the signal is decreased. The driver of the vehicle and/or passengers may compensate for increased external noise by increasing the volume of the audio system. However, when the vehicle speed decreases or another source of external noise is reduced, the audio system volume will be too high, thus annoying the driver and any passengers. To overcome this, U.S. Pat. Nos. 5,434,922 and 6,529,605 disclose dynamic volume control (DVC) systems which extract the noise signal from a signal provided by a sensor (e.g., a sensing microphone). The DVC system processes the signal from the sensor to calculate a control signal that is used to control the volume and/or dynamics of the desired signal (i.e., music).

The DVC system extracts the noise signal from mixed signals derived from the sensor (e.g., a microphone). The mixed signals comprise music components (i.e., the desired signal), voice components and noise components. The noise component is intended to be used solely for obtaining the control signal for the volume or dynamics of the desired signal. The other components (e.g., the music components and the voice components) should not have any effect on the derivation of the control signal. Otherwise, the system would respond to voice signals or control itself through the music, which would end in a so-called gain chase situation (i.e., direct feedback). Such gain chase situation can lead to instability in the entire audio system.

The music signal is extracted from the sensor signal using an adaptive filter. The voice signal left in the remaining signal mixture is then masked out using a voice activity detector (VAD). The VAD operates continuously in the time range—i.e., in a broadband manner—and is implemented by an averaging unit with permanently configured increments and decrements. In other words, as long as the input signal is larger than the output signal, the VAD increases its output signal by a fixed increment, or reduces it by a fixed decrement whenever the input signal is less than the VAD output signal. In this way, the VAD utilizes the different stationary properties of the voice and noise signals. The noise signal is strongly (broadband) smoothed so that the VAD output signal (i.e., the control signal), even if somewhat delayed, reaches a stationary final value, which approximately corresponds to the average power of the noise signal in the sensor signal. Depending on the configured volume or selected equalizing, which mainly refers in this instance to the bass setting, the music signal more or less penetrates the noise signal. That is, the louder the desired signal (music signal) is played or the higher the bass controller is set, the larger the share of the music signal that passes unfiltered through the adaptive filter. This can lead to the known gain chase situation described above, which is imperative to prevent.

It has been found that the adaptive filter works better (i.e., permits less of the desired signal to pass through it) if the signals have a narrower bandwidth. For this reason, the DVC system mostly works with strongly undersampled signals, which, on the one hand, reduces the implementation complexity, but, on the other hand, leads to a control signal which is derived solely from the low-frequency noise component and then applied in a broadband manner to control the volume or dynamics. Since low-frequency noise signals dominate in vehicles—the field for which most of the DVC systems are primarily designed—the spectral limitation described above can only actually be considered in this context. Nonetheless, the solution is not fully ideal and may lead to overlapping effects in certain circumstances, which is why a broadband solution is preferable. Although the risk of gain chase is reduced through limiting the bandwidth, it is not eliminated.

One way of avoiding gain chase is to place an upward limit on the control signal in accordance with the existing power of the desired signal which is implemented in common systems in the form of an anti-gain chase function. This function permits the control signal (provided the desired signal is below a specific minimum threshold value) to pass through the filter without being changed, but limits it to a maximum value specified by another function if the power of the desired signal rises above the threshold. In addition, this function blocks further control once the desired signal has exceeded a maximum threshold—i.e., the control signal is then replaced by zero. The control signal modified in this way can then be used to alter the volume and/or dynamics of the desired signal using a compressor. However, the control signal is, nevertheless, fully dependent on the mean power of the currently existing noise signal but does not consider its spectral distribution or coloring.

In this regard, systems known as dynamic equalizer control (DEC) systems are considered successors to DVC systems. However, one aspect that hinders the transition from DVC to DEC systems is the limited bandwidth with which DVC systems work. The reason why the bandwidth is limited is primarily to reduce the risk of gain chase, and the implementation complexity.

Therefore, there is a need for an improved system and method that automatically compensates for the noise level in a listening environment to enhance the audio listening experience within the environment.

SUMMARY OF THE INVENTION

A dynamic equalizer control (DEC) system digitally processes electrical audio signals to compensate for the intrusion of acoustic noise into a listening area.

A system for compensating for ambient noise in a listening environment comprises an audio system that produces an electrical sound signal and generates a sound output from the electrical sound signal. A sensor (e.g., a microphone) senses a total sound signal representative of the total sound level in the listening environment, including the sound output from the audio system and the ambient noise within the listening environment. A processing unit responsive to the total sound signal and the electrical sound signal extracts from the total sound signal an ambient noise signal representative of the ambient noise in the listening environment. A controller responsive to the ambient noise signal performs a linear predictive coding (LPC) analysis and generates a control signal, which is input to an equalizer to adjust the sound output of the audio system in order to compensate for the ambient noise level.

The DEC system measures the loudness of the music and noise in a vehicle and determines the effect of the noise on the perceived loudness of the music. The system then boosts the level of the music to compensate for the masking effect. The loudness of the music is determined by monitoring the music signal voltage coming from the music source. The sound in the vehicle includes music and noise as measured by the microphone. The microphone signal is converted to a digital representation, and the system uses digital processing to remove the music signal. The DEC includes hardware and appropriate software to shape the spectrum of the music and noise signal to mimic human hearing.

One aspect of the present invention is the application of LPC in a sound enhancement system. LPC is one of a family of analysis/resynthesis techniques developed for speech encoding, transmission and reception and is a widely used technique for computer-generated speech. LPC estimates the spectrum of a sound in terms of the filter coefficients which would be needed to synthesize that sound when applied to an excitation source, which may be either noise (for unvoiced sounds), or a band-limited pulse wave in which all the harmonics are of equal amplitude. In a synthesis application, both the excitation waveform and the filter coefficients can be modified (in both the frequency and time domains) to create related variants of the original sound. (see Richard Dobson, A Dictionary of Electronic and Computer Music Technology, Oxford University Press, 1992).

The present invention provides for a system that adjusts not only gain but equalization in response to the noise. The perception of high frequencies is not greatly affected by road noise, but bass frequencies are strongly masked. The DEC system controls the desired signal (music signal) according to the spectral distribution of the noise signal, and in doing so psychoacoustic aspects may also be considered when configuring the equalization.

The other systems, methods, features and advantages of the invention will be, or will become, apparent to one with skill in the art upon examination of the following figures and detailed description. It is intended that all such additional systems, methods, features and advantages be included within this description, be within the scope of the invention, and be protected by the following claims.

DESCRIPTION OF THE DRAWINGS

The invention can be better understood with reference to the following drawings and description. The components in the figures are not necessarily to scale, emphasis instead being placed upon illustrating the principles of the invention. Moreover, in the figures, like reference numerals designate corresponding parts throughout the different views.

DETAILED DESCRIPTION

Analysis shows that the main reason why adaptive filters fail in broadband applications is the wide dynamic range of the input signals. By limiting the system to a relatively narrow frequency band, the dynamics of the band-limited signal are reduced so the adaptive filter can work better. If the broadband input signals are divided into frequency bands in such a way that the band-limited signals exhibit dynamic characteristics with which an adaptive filter still functions without errors, the music signal can be removed from the sensor signal in a broadband manner. Synergy effects can in turn be used to improve efficiency as a consequence. For example, the divided desired signals can be used for a multipath loudspeaker without having to spectrally split the signals yet again. This also yields the additional advantage that the corresponding adaptive filter may also explicitly reproduce the appropriate frequency response of the corresponding loudspeaker.

The strongest noise signals in vehicles generally occur in the low frequency range, which means limiting to a frequency range, which however is much larger, without having to worry about the loss of effects. Since the sensor signal freed from the desired signal which is obtained from the adaptive filter is to be recompiled, the filters for splitting the signal into different bands must be perfect reconstruction or quasi-perfect reconstruction filters. An effective technique for implementing a quasi-perfect reconstruction filter for realization of a band splitting (i.e., crossover or X-over) filter is to use coupled all-pass filters.

Figure 1A:
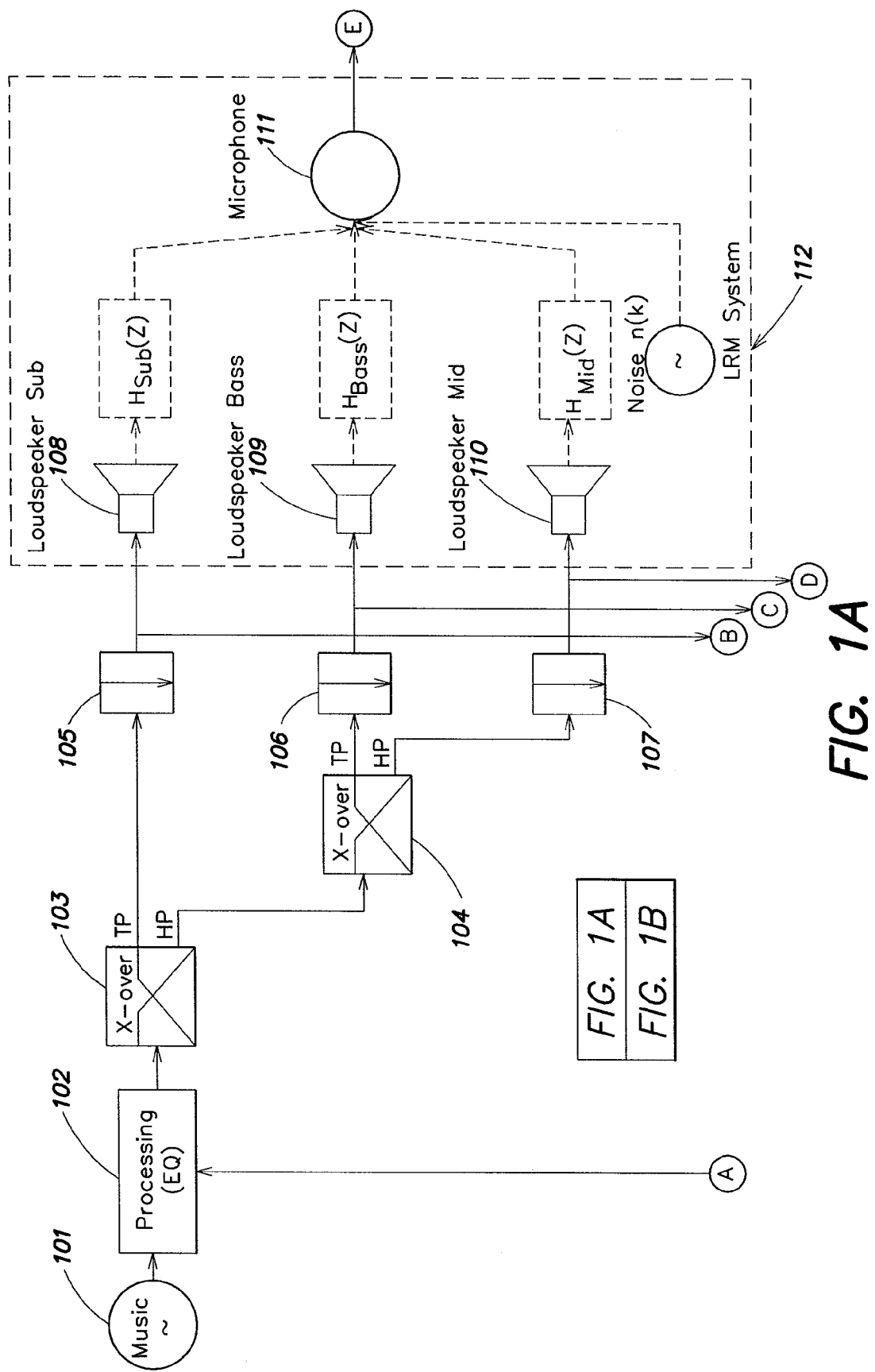
FIGS. 1A and 1B are block diagrams of a broadband system for removing a desired signal from a sensor signal.
Figure 1B:
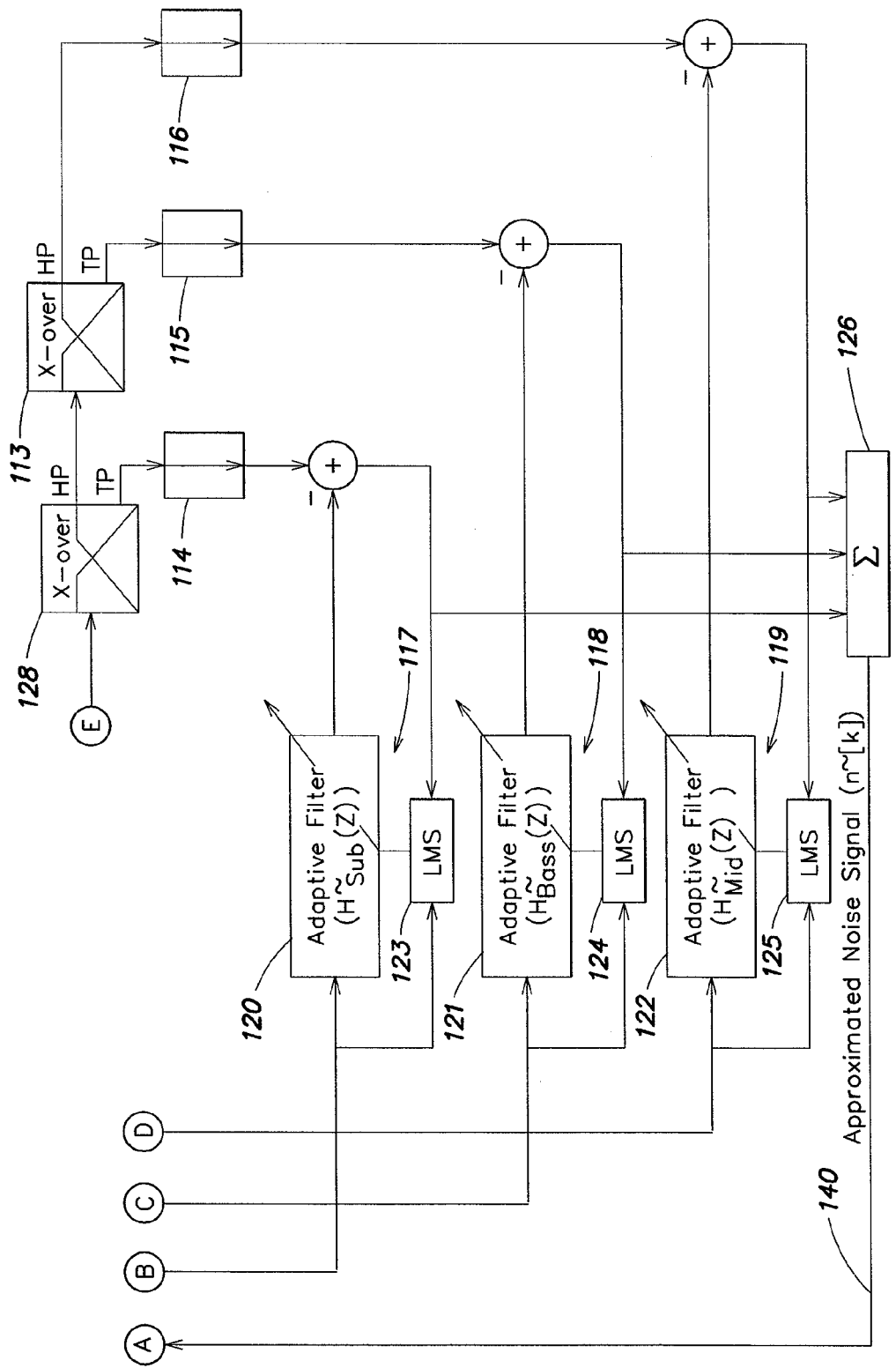

FIG. 1 illustrates a system for broadband removal of a desired signal from a sensor signal. A signal source 101 supplies a desired signal, e.g., a music signal from CD player, radio, cassette player or the like, to a processing unit 102. The processing unit may include an equalizing filter for equalizing the music signal based upon a control signal on a line 140. A first X-over network 103 is connected downstream of the processing unit 102, splitting the output signal from the processing unit 102 into a first higher frequency signal and into a first lower frequency signal. The first higher frequency signal is fed into second X-over network 104 and, accordingly, split into a second higher frequency signal and into a second lower frequency signal. The first lower frequency signal, the second lower frequency signal, and the second higher frequency signal are supplied to active loudspeakers 108, 109, 110 respectively via sample rate converters 105, 106, 107 respectively. The loudspeakers are located in a room, along with a microphone 111 that senses a total sound signal representative of the total sound level in the room (that is, the listening environment). The loudspeaker, room, and microphone form a so-called loudspeaker-room-microphone (LRM) system 112 that can by represented by certain transfer functions $H_{Sub}$, $H_{Bass}$, $H_{mid}$ between the respective loudspeakers 108, 109, 110 and the microphone 111. The signal representing the total sound level comprises both sound output from the loudspeakers and the ambient noise n[k] within the room.

A third X-over network 128 receives the total sound signal from the microphone 111, and splits the signal into a third lower frequency signal and a third higher frequency signal. The third higher frequency signal is split into a fourth lower frequency signal and a fourth higher frequency signal by a fourth X-over network 113. The third lower frequency signal, the fourth lower frequency signal, and the fourth higher frequency signal are supplied via sample rate converters 114, 115, 116 respectively to adaptive filters 117, 118, 119 which also receive the signals output by the sample rate converters 105, 106, 107. Each of the adaptive filters 117, 118, 119 comprises an associated filter core 120, 121, 122 receiving the signals output by the sample rate converters 105, 106, 107 respectively and control signals from control units 123, 124, 125 respectively. The control units 123, 124, 125 receive the signal output by the sample rate converters 105, 106, 107 and signals representing the difference of the signals output by the sample rate converters 114, 115, 116 and the signals output by the filter cores 120, 121, 122 respectively. The signals representing the differences are input to a summing unit 126, which generates an approximated noise signal n˜[k] that is supplied on a line 140 to the processing unit 102 as its control signal.

Assuming that the system illustrated in FIG. 1 is able to remove the desired signal from the sensor signal (i.e., microphone signal) so efficiently that only a small portion of the signal is left so that no more gain chase can occur, the question still remains as to how an equalizing filter from the sensor signal (without the desired signal) can be obtained. An effective mechanism of doing this in the time range is to compute Linear Predictive Coding (LPC) coefficients using LPC analysis, and to input the coefficients into a predictor filter with which the music signal is weighted.

It is known from other applications—e.g., acoustic echo cancellation (AEC)—that echo coefficients are calculated from the voice signal in those cases using LPC analysis, and that the coefficients are then fed into a predictor error filter for filtering the microphone signal. The voice signal recorded by the sensing microphone is spectrally smoothed so that the AEC system can work more efficiently. The AEC application therefore refers to a pre-whitening filter whose effects can be described as follows: the LPC analysis supplies coefficients that are used in a corresponding predictor filter that calls a transfer function corresponding to the power spectral density (PSD) of the signal (i.e., voice signal) examined by the analysis. When used in a predictor error filter, its transfer function does not follow the PSD of the analysis signal, but rather the inverse pattern. For this reason, the voice component in the microphone signal on which the LPC analysis was based is spectrally smoothed after the predictor error filter—i.e., it is whitened (thus giving rise to the term "pre-whitening filter").

The analysis/synthesis method known as linear predictive coding (LPC) is efficient and effective in achieving synthetic speech and speech signal communication. The efficiency of the method is due to the speed of the analysis algorithm and the low bandwidth required for the encoded signals. The effectiveness is related to the intelligibility of the decoded vocal signal. The LPC implements a type of vocoder which is an analysis/synthesis scheme where the spectrum of a source signal is weighted by the spectral components of the target signal that is being analyzed. The phase vocoder is, for example, a special kind of vocoder where amplitude and phase information of the analysis channels is retained and can be used as coefficients for an error filter.

In the standard formulation of LPC, the source signals are either a white noise or a pulse train, thus resembling voiced or unvoiced excitations of the vocal tract, respectively. A basic assumption behind LPC is the correlation between the n-th sample and the P previous samples of the target signal. Namely, the n-th signal sample is represented as a linear combination of the previous P samples, plus a residual representing the prediction error. The analysis problem is equivalent to the identification of the coefficients a of an all pole filter. If minimizing the error in a mean square sense, the problem translates into a set of P equations which, in the z domain (frequency domain), reduce to:

$$E(z)=A(z)X(z)$$

where $A(z)$ is the polynomial with coefficients a and $E(z)$ is the prediction error. In the case of voice signal analysis, the filter $1/A(z)$ is referred to as the all pole formant filter because, if the proper order P is chosen, its magnitude frequency response follows the envelope of the signal spectrum, with its broad resonances called formants. The filter $A(z)$ is referenced to as the inverse formant filter because it extracts from the voice signal a residual resembling the vocal tract excitation. $A(z)$ is also referred to as a whitening filter because it produces a residual having a flat spectrum.

However, there are two kinds of residuals, both having a flat spectrum: the pulse train and the white noise, the first being the idealized vocal-fold excitation for voiced speech, the second being the idealized excitation for unvoiced speech. In reality, the residual is neither one of the two idealized excitations. At the resynthesis stage the choice is either to use an encoded residual or to choose one of the two idealized excitations according to a voiced/unvoiced decision made by the analysis stage.

When the target signal is periodic (voiced speech), a pitch detector can be added to the analysis stage, so that the resynthesis can be driven by periodic replicas of a basic pulse, with the correct inter-pulse period. Several techniques are available for pitch detection, either using the residual or the target signal. Although not particularly efficient, one possibility is to do a Fourier analysis of the residual and estimate the fundamental frequency by the techniques of section. For example, the information extracted by the analysis stage are the prediction coefficients $a_1, \ldots a_p$; the residual e; pitch of the excitation residual; voiced/unvoiced information; and signal energy (RMS amplitude). These parameters, possibly modified, are used in the resynthesis stage, for example, by Levinson-Durbin recursion, which provides the reflection coefficients of the lattice realization of the filter $1/A(z)$.

Figure 2:
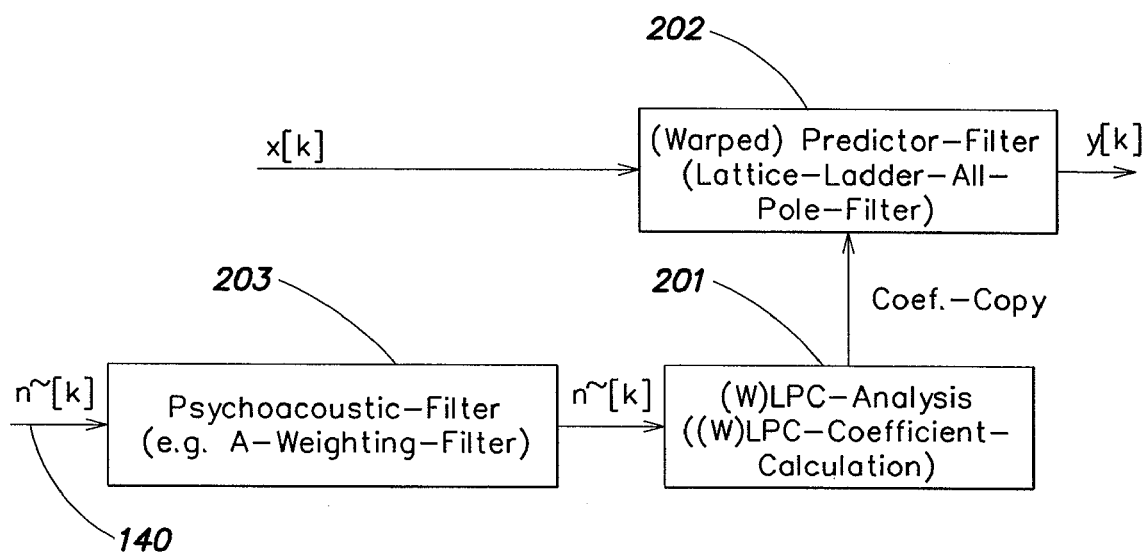
FIG. 2 is a block diagram of a DEC system operating in the time domain.

FIG. 2 is a block diagram of a DEC system operating in the time domain. Such DEC system may be implemented in the processor unit 102 of FIG. 1. The estimated noise signal n˜[k] representing the microphone (sensor) signal cleansed of the music signal is input to an LPC analysis unit 201, and the LPC coefficients (echo coefficients) obtained are input into a predictor filter 202. A music signal x[k] from a signal source 101 of FIG. 1 is also input to the predictor filter 202. The music signal x[k] is weighted or equalized in accordance with the existing power spectral density of the analysis signal. To take account of human hearing, there are two major factors to consider. On the one hand, the human ear is sensitive both to frequency and loudness. The maximum sensitivity is about 1-2 kHz, and it deteriorates both toward higher as well as lower frequencies.

This relationship is considered in FIG. 2 using a psychoacoustic filter 203 (for example, an A-weighting filter), which approximately matches the mean value of the audio characteristics of the human ear. On the other hand, the human ear has a frequency resolution that increases with decreasing frequency. This characteristic is to be considered by the LPC analysis. Its accuracy therefore increases with decreasing frequency. A corresponding non-linear LPC analysis function in terms of frequency can be realized using the so-called warped LPC (WLPC) analysis where the predictor filter is also configured as a warped predictor filter. Using such a system, a weighted output signal y[k] is obtained that varies according to the current noise signal, regardless of whether the system has a psychoacoustic filter or not, or whether it uses conventional LPC analysis or WLPC analysis. Different ways to implement conventional or warped LPC are, for example, disclosed in Aki Härmä, "Linear predictive coding with modified filter structures"; Aki Härmä, "Evaluation of a warped linear predictive coding scheme"; Aki Härmä, Unto K. Laine, "A comparison of warped and conventional linear predictive coding" (available on the internet under www.acoustics.hut.fi) which are herein included by reference.

One issue that has been ignored so far is that the voice signal, which is still contained in the remaining signal $n\tilde{}[k]$, has the effect in the DEC model described above that the equalizing varies according to the voice signal. Although this may not cause any inconvenience for a person talking, for whom the equalizing is altered according to the voice signal, as this represents a type of masking for the speaker, it can be problematic for all other persons in the same environment. The equalizing caused by the voice has an annoying effect—for example, because the addressed persons want to clearly understand the speaker's voice and do not want the voice to be dominated by the music signal. One solution is to set the update time of the LPC analysis in such a way that the LPC coefficients adapt themselves according to the background noise signal (which changes slowly in comparison to the voice signal) and do not or only slightly respond to the voice signal.

An efficient computational method for the LPC coefficients is provided by the Gradient Adaptive Lattice (GAL) algorithm, with which any number of LPC coefficients can be recursively computed without using the relatively complex Levinson-Durbin algorithm. The filter structure with which the GAL algorithm can be realized is known as Adaptive Lattice Predictor (ALP).

Figure 3:
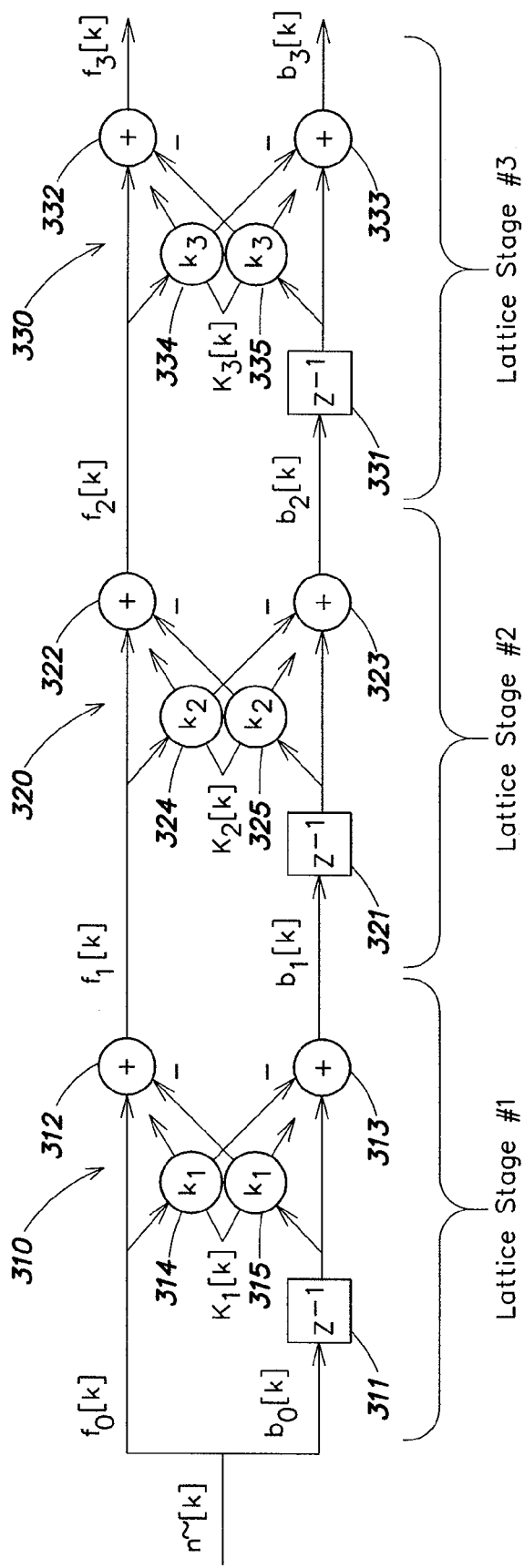
FIG. 3 is a block diagram of a 4th-order Adaptive Lattice Predictor (ALP) filter.

An applicable 4th-order adaptive lattice predictor (ALP) filter is illustrated in FIG. 3. This filter comprises three stages 310, 320, 330 of identical structure. Each stage has two branches, where the first branch transmits signals $f_0[k]$, $f_1[k]$, $f_2[k]$, $f_3[k]$, and the second branch transmits signals $b_0[k]$, $b_1[k]$, $b_2[k]$, $b_3[k]$. Each second branch comprises a delay unit 311, 321, 331 and each stage comprises subtractors 312, 313; 322, 323; 332, 333, respectively. The subtractors are used for cross-coupling of the two branches via controllable coefficient elements 314, 315; 324, 325; 334, 335 so that their coefficients $K_1$, $K_2$, $K_3$ are controlled by signals $K_1[k]$, $K_2[k]$, $K_3[k]$. The signals $f_0[k]$ and $b_0[k]$ are obtained from the estimated noise signal $n\tilde{}[k]$.

The equations with which the coefficients of the ALP filter, $K_1, \ldots, K_{N-1}$ (which resemble the LPC coefficients) are updated are similar to the GAL algorithm. The GAL algorithm can be described as follows:

$$K_n[k+1] = K_n[k] + \frac{\alpha}{P_n[k]} * (f_{n-1}[k] * b_n[k] + b_{n-1}[k-1] * f_n[k])$$

with $$P_n[k] = (1-\alpha) * P_n[k-1] + \alpha * (f_{n-1}[k]^2 + b_{n-1}[k-1]^2),$$

$$n = 1, \ldots, N-1$$

Figure 4:
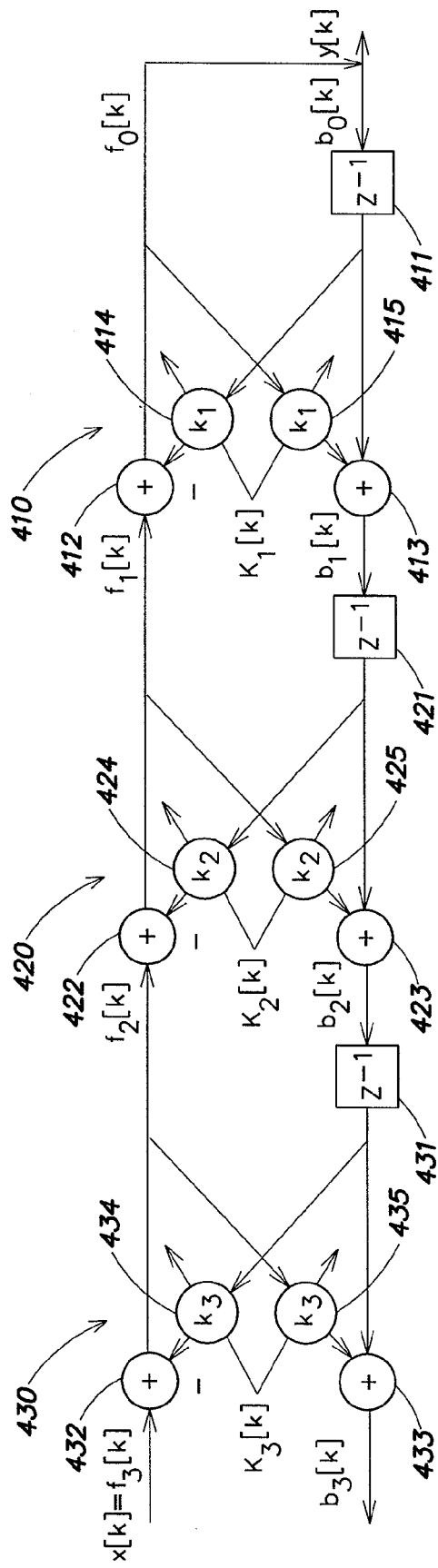
FIG. 4 is a block diagram of a predictor filter designed as a lattice ladder all-pole filter.

The LPC coefficients determined using the ALP filter are input into a predictor filter, which may be designed as a lattice ladder all-pole filter as shown in FIG. 4.

The Lattice Ladder All-Pole Filter of FIG. 4 comprises three stages 410, 420, 430 of identical structure. Each stage has two branches wherein a return branch transmits signals $f_0[k]$, $f_1[k]$, $f_2[k]$, $f_3[k]$, and a forward branch transmits signals $b_0[k]$, $b_1[k]$, $b_2[k]$, $b_3[k]$ wherein $f_3[k]=x[k]$ and $f_0[k]=b_0[k]=y[k]$. The return branches each comprise an associated delay unit 411, 421, 431 and an adder 413, 423, 433, respectively. Each of the forward branches comprises an associated subtractor 412, 422, 432. The subtractors and adders are used for cross-coupling of the two branches via controllable coefficient elements 414, 415; 424, 425; 434, 435 so that their coefficients $K_1$, $K_2$, $K_3$ are controlled by signals $K_1[k]$, $K_2[k]$, $K_3[k]$.

The time range solution is not an optimum solution since it labors under two weaknesses. Firstly, it is doubtful that the voice signal component still in the remaining signal $n\tilde{}[k]$ can be removed simply by using a lengthy update time. Secondly, an equalizing function that corresponds to the noise PSD characteristics either with or without A-filter weighting is not satisfactory. This can clearly be seen when considering a typical noisy situation in an automobile, for example. In this case, the power spectral density of the noise signals is somewhat pink—i.e., equalizing configured in this way would mainly raise the lower spectrum range, but omit the middle and upper ranges. As a consequence, the desired signal would be colored by a listener in that automobile and a signal would be obtained that can partially deviate from the original signal, a situation that is generally undesirable.

Options for prevention of voice components in the microphone or remaining signal are discussed in the following with reference to FIGS. 5-8.

Figure 5:
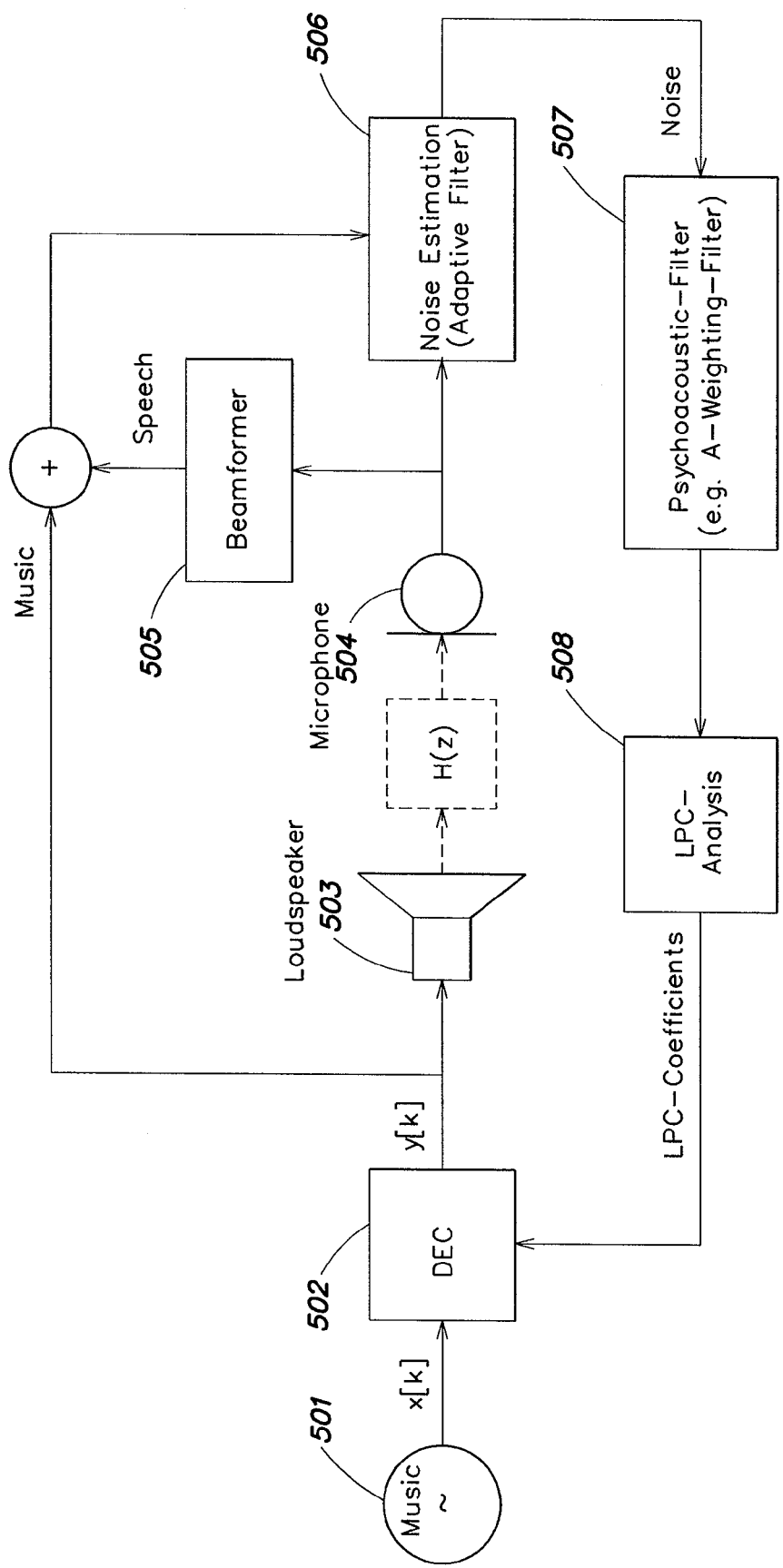
FIG. 5 is a block diagram of a DEC system that includes a beamformer and an adaptive filter.

FIG. 5 illustrates a combination of a beamformer and an adaptive filter. Beamformers are electronically steerable arrays of microphones which in combination with a phase shift network can put emphasis on a certain direction and in combination with location estimator algorithms pinpoint the location of a talker in a room. Different kinds of beamers are known, for example, from U.S. Patent Application US20030053639A1. The present beamformer can be implemented either in software (beamforming filter) or hardware (for example, pressure gradient microphones, pipe slit microphones, etc.). In the DEC system of FIG. 5, a music signal x[k] from a music signal source 501 is fed into dynamic equalization control (DEC) unit 502 providing an equalized signal y[k] to a loudspeaker 503. The loudspeaker 503 generates an acoustic signal transferred to a microphone 504, where the transferal can be described by a transfer function H(z). The signal from the microphone 504 is supplied to a beamformer unit 505 and an adaptive filter 506 for estimating the noise in the microphone signal. The microphone signal represents the total sound level in the environment, where the total sound level comprises both the sound output from the loudspeaker 503 and the ambient noise within the environment where the loudspeaker 503 and the microphone 504 are located (LRM system). A signal output by the beamformer unit 505 is subtracted from the signal y[k] from the DEC unit 502 to obtain a reference signal for the adaptive filter 506. The signal output by the adaptive filter 506 is transferred via a psychoacoustic filter 507 (e.g., an A-weighting filter) to an LPC analysis unit 508 for calculating the coefficients of the DEC unit 502.

In this combination of a beamformer (beamformer unit 505) and a unit for estimating the noise signal (adaptive filter 506) which can be designed in the manner shown in FIG. 1, for example, the voice signal is isolated from the remaining signal components using the space/time filter effects of a beamformer, and is therefore available to the subsequent adaptive filter in addition to the actual signal required (music) as a further reference signal. The adaptive filter then excludes the signal components from the microphone signal that are correlated with the resulting reference signal. The disadvantage of this method is that the beamformer does not process the voice signal alone, but also includes noisy components that principally come from the direction in which the beamformer was directed. These noisy components adopted by the beamformer then likewise become part of the reference signal and are therefore computationally removed from the microphone signal, so that the estimated noise signal is corrupted. Normally, the degree of corruption increases with falling frequency since beamformers generally have great difficulty in obtaining adequate detector efficiency at low frequencies.

Figure 6:
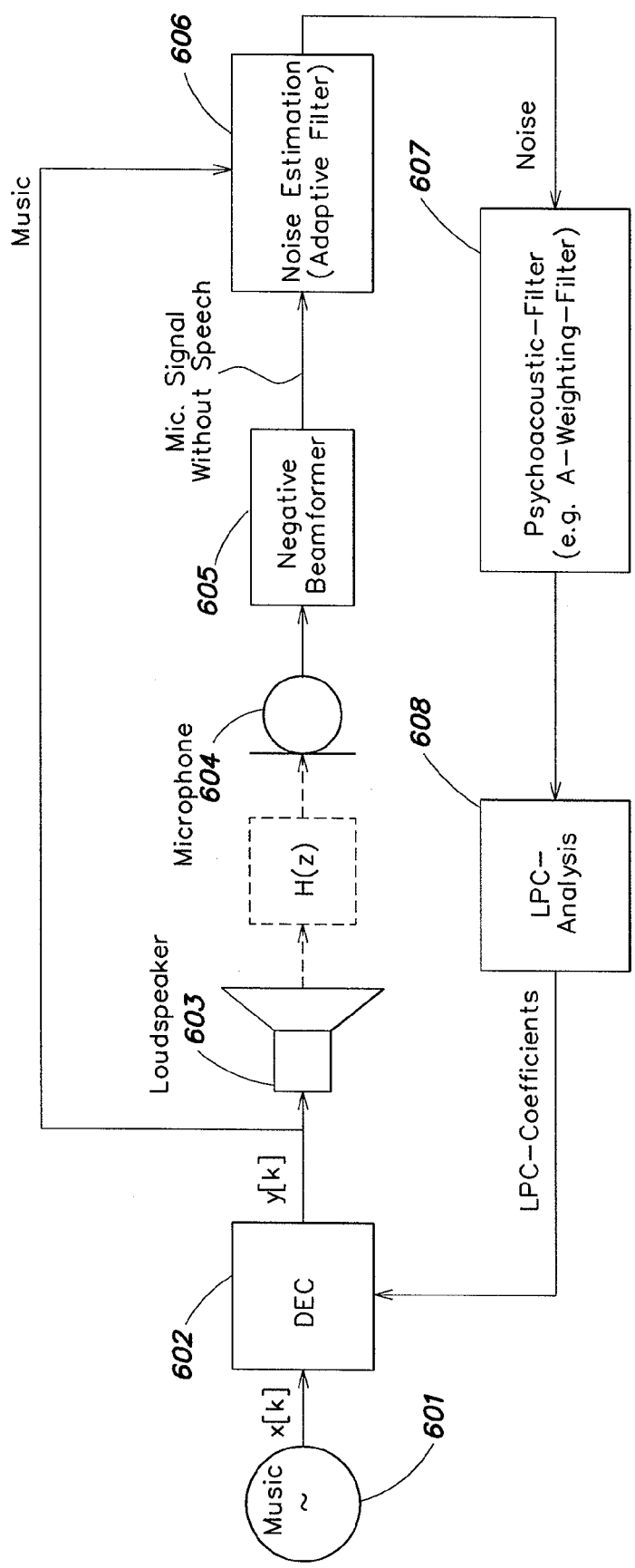
FIG. 6 is a block diagram of a DEC system that includes a negative beamformer and an adaptive filter.

FIG. 6 illustrates a combination of a negative beamformer and an adaptive filter. In the DEC system of FIG. 6, a music signal x[k] from a music signal source 601 is fed into dynamic equalization control (DEC) unit 602 which provides an equalized signal y[k] to a loudspeaker 603. The loudspeaker 603 generates an acoustic signal, which is detected by a microphone 604 where the transferal can be described by a transfer function H(z). The signal from the microphone 604 is supplied to a negative beamformer unit 605 that is connected upstream of an adaptive filter 606 for estimating the noise in the microphone signal. The microphone signal represents the total sound level in the listening environment, where the total sound level comprises both the sound output from the loudspeaker 603 and the ambient noise within the environment (LRM system) except for voice signals. The signal y[k] from the DEC unit 602 is used as a reference signal for the adaptive filter 606. The signal output by the adaptive filter 606 is transferred via a psychoacoustic filter 607 (e.g., an A-weighting filter) to an LPC analysis unit 608 for calculating the coefficients of the DEC unit 602.

In the system of FIG. 6 the voice signal component in the microphone signal is suppressed using a negative beamformer. Here the expression "negative" means that the beamformer pointing in the direction of the speaker has a spatial zero position and therefore does not detect signals from this direction that are dominated by the voice signal. The beamformer can be implemented either in software (beamforming filter) or hardware (for example, pressure gradient microphones, pipe slit microphones, etc.). The problem with this system is that what is actually of interest is the noise situation precisely where the driver, for example, is sitting or in the vicinity of the driver's head, and that signals from exactly this direction are not permitted to be excluded for this reason. However, this is what happens when using a beamformer since it does not isolate the signals in any way, but rather suppresses all signals coming from the direction in which the spatial zero point was positioned.

If the microphone signal is converted to the spectral range, an individual voice activity detector (VAD) can be applied for each spectral line, similar to individual DVC systems. Using the VAD, the voice signal component can be computationally removed from the microphone signal. If the VAD output signal (which corresponds to the estimated noise signal) is then again reconverted to the time domain, it can be reused for the LPC analysis. Such a combination between time and spectral processing are shown in FIG. 7.

Figure 7:
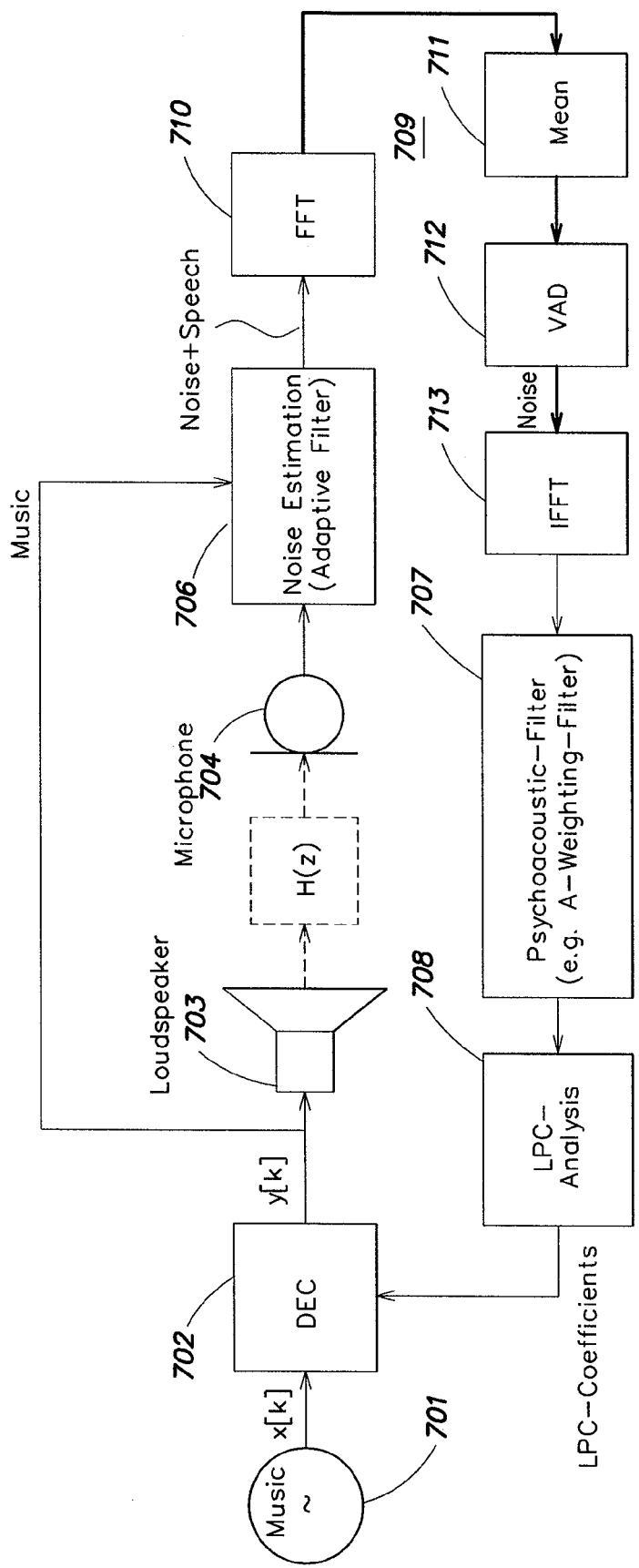
FIG. 7 is a block diagram of a DEC system that includes time and spectral processing.

In the system of FIG. 7, the voice signal component in the microphone signal is suppressed in the frequency domain. A music signal x[k] from a music signal source 701 is fed into dynamic equalization control (DEC) unit 702, which provides an equalized signal y[k] to a loudspeaker 703. The loudspeaker 703 generates an acoustic signal from the signal y[k], and the acoustic signal is transferred to a microphone 704 where the transferal can be described by a transfer function H(z). The signal from the microphone 704 is supplied to an adaptive filter 706 for estimating the noise in the microphone signal. The microphone signal represents the total sound level in the environment, where the total sound level comprises both the sound output from the loudspeaker 703 and the ambient noise within the environment (LRM system). The signal y[k] from the DEC unit 702 is used as a reference signal for the adaptive filter 706. The signal output by the adaptive filter 706 is transferred via a spectral voice suppression unit 709 and a psychoacoustic filter 707 (e.g., an A-weighting filter) to an LPC analysis unit 708 for calculating the coefficients of the DEC unit 702. The voice suppression unit 709 comprises a Fast-Fourier transform (FFT) unit 710 for transforming from the time domain into the frequency domain. In a mean calculation unit 711 the signals in the frequency domain are averaged and supplied to an voice activity decoder (VAD) 712 for detecting spectral voice signal components in the signals in the frequency domain from the FFT unit 710. The signals from the VAD 712 are subsequently transformed back to the time domain by an inverse Fourier Transform unit 713 and the resulting time domain signal is input to the psychoacoustic filter 707.

The above-mentioned systems may be implemented in microprocessors, signal processors, microcontrollers, computing devices etc. The individual system components are in this case hardware components of the microprocessors, signal processors, microcontrollers, computing devices, etc. which are correspondingly implemented by software.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. Further, the methods of the invention may be achieved in either all software implementations, using the appropriate processor instructions, or in hybrid implementations that utilize a combination of hardware logic and software logic to achieve the same results. Such modifications to the inventive concept are intended to be covered by the appended claims.

What is claimed is:

1. A method for enhancing the sound signal produced by an audio system in a listening environment by compensating for ambient sound in the listening environment, comprising the steps of:

producing an audio sound signal;

measuring the total sound level in the listening environment and generating a signal representative thereof;

filtering the audio sound signal and the total sound signal, to extract a signal representing the ambient sound level within the listening environment;

comparing the audio sound signal with the signal representing the ambient sound level;

performing a linear predictive coding (LPC) analysis to generate a control signal; and adjusting the output from the audio sound signal comprises prediction filtering to compensate for the ambient noise level.

2. The method of claim 1, where the step of adjusting the output from the audio sound signal comprises warped prediction filtering.

3. The method of claim 1, where the prediction filtering step comprises lattice ladder all pole filtering.

4. The method of claim 1, where the linear predictive coding (LPC) analysis comprises performing a LPC coefficient calculation.

5. The method of claim 1, where the linear predictive coding (LPC) analysis comprises performing a warped LPC analysis.

6. The method of claim 5, where the warped LPC analysis comprises perfoiming a warped LPC coefficient calculation.

7. The method of claim 1, where the linear predictive coding (LPC) analysis comprises perfoi ming a gradient adaptive lattice algorithm.

8. The method of claim 1, where in a psycho-acoustic filtering step a weighted ambient noise signal is generated from the ambient noise signal.

9. The method of claim 8, where the psycho-acoustic filtering comprises performing a A-weighting filtering.

10. The method of claim 1, where in a voice pass step a voice signal is extracted from the total sound signal, and the voice signal is subtracted from the electrical sound signal.

11. The method of claim 10, where the voice pass step comprises performing a beamforming step.

12. The method of claim 1, comprising a voice stop step to suppress a voice signal in the total sound signal.

13. The method of claim 12, where the voice stop step comprises performing an inverse beamforming step.

14. The method of claim 1, where the ambient noise signal is filtered in a spectral voice suppressing step for suppressing a voice signal in the ambient noise signal.

15. The method of claim 14, where the voice suppressing step comprises:
   time-to-frequency transforming the ambient noise signal to generate spectral noise signals;
   calculating mean spectral noise signals from the spectral noise signals;
   suppressing a voice signal in the mean spectral noise signals; and
   frequency-to-time transforming the mean spectral noise signals having the voice signal suppressed into an ambient noise signal.

16. The method of claim 15, where the voice activity detecting step comprises calculating the long term steady state of the ambient noise signal and calculating the short-term steady state of the voice signal, and comparing the long-term steady state of the ambient noise signal and the short-term steady state of the voice signal.

17. The method of claim 1, where the step of producing an audio sound signal comprises:
   splitting the audio signal into at least two signals in different frequency ranges; and
   extracting signals in frequency ranges corresponding to the frequency ranges of the splitting step from the total sound signal.

18. The method of claim 1, where filtering the audio sound signal comprises adaptively filtering the audio sound signal.

19. The method of claim 18, where adaptively filtering the audio signal comprises performing a least mean square (LMS) computation.

* * * * *

UNITED STATES PATENT AND TRADEMARK OFFICE
CERTIFICATE OF CORRECTION

PATENT NO.       : 8,170,221 B2
APPLICATION NO.  : 11/944876
DATED            : May 1, 2012
INVENTOR(S)      : Markus Christoph It is certified that error appears in the above-identified patent and that said Letters Patent is hereby corrected as shown below:

Column 11
Claim 6, line 8, please delete "perfoiming" and insert --performing--
Claim 7, line 10, please delete "perfoi ming" and insert --performing--

Signed and Sealed this
Third Day of July, 2012

David J. Kappos
*Director of the United States Patent and Trademark Office*